(12) United States Patent
Kimura et al.

(10) Patent No.: US 11,845,158 B2
(45) Date of Patent: *Dec. 19, 2023

(54) THICKNESS MEASURING APPARATUS

(71) Applicant: DISCO CORPORATION, Tokyo (JP)

(72) Inventors: Nobuyuki Kimura, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 649 days.

This patent is subject to a terminal disclaimer.

(21) Appl. No.: 17/065,225

(22) Filed: Oct. 7, 2020

(65) Prior Publication Data

US 2021/0107112 A1 Apr. 15, 2021

(30) Foreign Application Priority Data

Oct. 15, 2019 (JP) ................................ 2019-188426

(51) Int. Cl.
*B24B 49/04* (2006.01)
*G01B 11/06* (2006.01)
(Continued)

(52) U.S. Cl.
CPC .............. *B24B 49/04* (2013.01); *G01B 11/06* (2013.01); *H01L 21/67253* (2013.01); *H01L 21/687* (2013.01)

(58) Field of Classification Search
CPC ..... B24B 49/04; G01B 11/06; G01B 11/0625; G01B 11/0683; G01B 2210/48;
(Continued)

(56) References Cited

U.S. PATENT DOCUMENTS 5,473,166 A 12/1995 Imai et al.
6,974,963 B2 12/2005 Tanaka et al.
(Continued)

FOREIGN PATENT DOCUMENTS

JP 1073321 A2 1/2001
JP 2011143488 A1 * 7/2011 ............. B24B 49/04
(Continued)

OTHER PUBLICATIONS

Office Action issued in counterpart German patent application No. 10 2020 212 956.8, dated Dec. 9, 2022.

*Primary Examiner* — Michael A Lyons
(74) *Attorney, Agent, or Firm* — Greer, Burns & Crain, Ltd.

(57) ABSTRACT

A thickness measuring apparatus that measures a thickness of a workpiece held by a chuck table. The thickness measuring apparatus includes plural image sensors that detect intensity of light spectrally split on each wavelength basis by plural diffraction gratings and generate a spectral interference waveform and a thickness output unit that outputs thickness information from the spectral interference waveform generated by the plural image sensors. The thickness output unit includes a reference waveform recording section in which spectral interference waveforms corresponding to plural thicknesses are recorded as reference waveforms and a thickness deciding section that compares plural spectral interference waveforms generated by the plural image sensors with the reference waveforms recorded in the reference waveform recording section and decides the thickness corresponding to each spectral interference waveform from the reference waveform that corresponds to the spectral interference waveform in the waveform shape.

7 Claims, 7 Drawing Sheets

(51) Int. Cl.
*H01L 21/687* (2006.01)
*H01L 21/67* (2006.01)

(58) Field of Classification Search
CPC ............ G01B 2290/65; G01B 11/0675; G01B 11/0608; G01B 11/0616; H01L 21/67253; H01L 21/687; H01L 22/12; G01N 21/8851; G01N 21/9501; G01N 2021/8887
See application file for complete search history.

(56) References Cited

U.S. PATENT DOCUMENTS

| | | |
|---|---|---|
| 10,228,551 B1 | 3/2019 | Dietz et al. |
| 2002/0057437 A1 | 5/2002 | Mcmillen et al. |
| 2004/0223165 A1 | 11/2004 | Kurokawa et al. |
| 2006/0098206 A1 | 5/2006 | Kim et al. |
| 2011/0279822 A1 | 11/2011 | Kannaka et al. |
| 2012/0287426 A1* | 11/2012 | Sasazawa .......... G01B 11/0641 356/300 |
| 2013/0109112 A1 | 5/2013 | Grimbergen |
| 2014/0067319 A1* | 3/2014 | Ogura .................. G01B 11/24 702/167 |
| 2019/0101373 A1 | 4/2019 | Ghim et al. |

FOREIGN PATENT DOCUMENTS

| | | | |
|---|---|---|---|
| JP | 2012021916 A | 2/2012 | |
| JP | 2018021760 A | 2/2018 | |
| KR | 100532553 B1 * | 12/2005 | ........... B24B 37/013 |
| WO | WO-2004079294 A2 * | 9/2004 | ........ G01B 11/0608 |
| WO | WO-2008011866 A1 * | 1/2008 | ........ G01B 11/2441 |
| WO | WO-2012120779 A1 * | 9/2012 | ............. B29B 17/02 |

\* cited by examiner

| Coordinates | Thickness of layer A (μm) | Thickness of layer B (μm) |
|---|---|---|
| $x_1, y_1$ | $TA_1$ | $TB_1$ |
| $x_2, y_1$ | $TA_2$ | $TB_2$ |
| $x_3, y_1$ | $TA_3$ | $TB_3$ |
| $x_4, y_2$ | $TA_4$ | $TB_4$ |
| $x_5, y_2$ | $TA_5$ | $TB_5$ |
| $x_6, y_2$ | $TA_6$ | $Tb_6$ |
| $x_{n-6}, y_I$ | $TA_{n-6}$ | $TB_{n-6}$ |
| $x_{n-5}, y_I$ | $TA_{n-5}$ | $TB_{n-5}$ |
| $x_{n-4}, y_I$ | $TA_{n-4}$ | $TB_{n-4}$ |
| $x_{n-3}, y_I$ | $TA_{n-3}$ | $TB_{n-3}$ |
| $x_{n-2}, y_J$ | $TA_{n-2}$ | $TB_{n-2}$ |
| $x_{n-1}, y_J$ | $TA_{n-1}$ | $TB_{n-1}$ |
| $x_n, y_J$ | $TA_n$ | $TB_n$ |

130

THICKNESS MEASURING APPARATUS

BACKGROUND OF THE INVENTION

Field of the Invention

The present invention relates to a thickness measuring apparatus that measures a thickness of a workpiece held by a chuck table.

Description of the Related Art

A wafer on which plural devices such as an integrated circuit (IC) and a large scale integration (LSI) are formed on a front surface in such a manner as to be marked out by plural planned dividing lines that intersect is thinned through grinding of a back surface by a grinding apparatus. Thereafter, the wafer is divided into individual device chips by a dicing apparatus or a laser processing apparatus. The divided device chips are used for pieces of electrical equipment such as mobile phones and personal computers.

The grinding apparatus that grinds the back surface of the wafer is substantially composed of a chuck table that holds the wafer, a grinding unit rotatably including a grinding wheel that grinds the wafer held by the chuck table, and a measuring apparatus that measures a thickness of the wafer held by the chuck table. The grinding apparatus can process the wafer into a desired thickness.

Furthermore, the measuring apparatus that measures the thickness involves a problem that a scratch is made in the ground surface when a measuring apparatus of a contact type that brings a prober into contact with the ground surface of the wafer to measure the thickness of the wafer is used. Therefore, a measuring apparatus of a non-contact type is used that measures the thickness by a spectral interference waveform formed by light reflected from the ground surface of the wafer and light that has been transmitted through the wafer and been reflected from the opposite surface (for example, refer to Japanese Patent Laid-Open No. 2012-21916).

SUMMARY OF THE INVENTION

However, in the case of measuring a thickness by executing waveform analysis with the spectral interference waveform and a waveform function, there is a problem that the waveform analysis based on the Fourier transform theory and so forth needs to be executed on this spectral interference waveform to obtain a signal intensity waveform and the accuracy when thickness information is obtained based on a peak value lowers as the wafer becomes thinner. Further, when the material that forms the workpiece differs, a waveform shape of the spectral interference waveform differs for each material, and it is difficult to execute proper waveform analysis. In particular, when the workpiece is a composite wafer obtained through stacking of plural materials, the spectral interference waveform is formed based on return light that has been reflected at each layer and been combined. Therefore, a problem that it is difficult to detect the thickness of the individual layers occurs.

Further, for example, there is the following problem when a wafer of a two-layer structure in which an $SiO_2$ film that is comparatively thin, for example, with a thickness of 3 μm or smaller, is stacked on a lower surface of an LN substrate is measured by a measuring apparatus based on the spectral interference waveform. Specifically, plural kinds of interfering light are formed by diffraction gratings that configure the measuring apparatus. Thus, thickness information of the LN substrate generated by an interference wave between light reflected from an upper surface of the LN substrate and reflected light reflected from the lower surface of the LN substrate and thickness information of "LN substrate+$SiO_2$ film" generated by an interference wave between the light reflected from the upper surface of the LN substrate and reflected light reflected from a lower surface of the $SiO_2$ film are synthesized, and it is impossible to detect only the thickness of the LN substrate.

Moreover, when two or more kinds of devices are formed in the planar direction of one layer that configures a wafer, there is a problem that the interference wave differs depending on the material that forms the device, and it is impossible to measure the accurate thickness.

Thus, an object of the present invention is to provide a thickness measuring apparatus that can measure a thickness of a workpiece easily and with high accuracy.

In accordance with an aspect of the present invention, there is provided a thickness measuring apparatus that measures a thickness of a workpiece held by a chuck table. The thickness measuring apparatus includes a light source that emits white light, a plurality of light condensers that condense the white light emitted by the light source on the workpiece held by the chuck table, a plurality of first optical paths that make the light source and the light condensers communicate with each other, and a plurality of optical branch parts that are disposed on the plurality of first optical paths respectively and cause reflected light reflected from the workpiece held by the chuck table to branch into a plurality of second optical paths. The thickness measuring apparatus also includes a plurality of diffraction gratings each disposed on the plurality of second optical paths, a plurality of image sensors that detect intensity of light spectrally split on each wavelength basis by the plurality of diffraction gratings and generate a spectral interference waveform, and thickness output means that outputs thickness information from the spectral interference waveform generated by the plurality of image sensors. The light condensers include a plurality of fθ lenses disposed to share a measurement region of the workpiece and a plurality of scanners disposed corresponding to the fθ lenses. The thickness output means includes a reference waveform recording section in which spectral interference waveforms corresponding to a plurality of thicknesses are recorded as reference waveforms and a thickness deciding section that compares a plurality of spectral interference waveforms generated by the plurality of image sensors with the reference waveforms recorded in the reference waveform recording section and decides a thickness corresponding to each spectral interference waveform from the reference waveform that corresponds to the spectral interference waveform in a waveform shape.

Preferably, the reference waveform recording section includes a plurality of material-by-material reference waveform recording sections in which reference waveforms are recorded according to a material that forms the workpiece, and the thickness deciding section of the thickness output means compares the spectral interference waveform generated by the image sensor with the reference waveforms recorded in the plurality of material-by-material reference waveform recording sections included in the reference waveform recording section and selects the material-by-material reference waveform recording section to which the reference waveform that corresponds to the spectral interference waveform in a waveform shape belongs.

The workpiece is a composite wafer configured to include at least a layer A and a layer B. Preferably, the workpiece composed of two or more kinds of materials is a composite wafer that is includes at least a layer A and a layer B and in which the layer B is composed of a plurality of materials in a planar direction. Preferably, the light source can be selected from any of a super luminescent diode (SLD) light source, an amplified spontaneous emission (ASE) light source, a supercontinuum light source, a light-emitting diode (LED) light source, a halogen light source, a xenon light source, a mercury light source, and a metal halide light source.

According to the thickness measuring apparatus of the present invention, the thickness of the workpiece can be measured easily and with high accuracy. Further, even with the workpiece formed of a structure with plural layers, the thicknesses can be accurately measured according to the materials of the respective layers.

Further, according to a processing apparatus including the thickness measuring apparatus of the present invention, the thickness of the workpiece can be measured easily and with high accuracy. Moreover, even with the workpiece formed of a structure with plural layers, the thicknesses can be accurately measured according to the materials of the respective layers, and the workpiece can be efficiently processed into a desired thickness.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTON OF THE PREFERRED EMBODIMENT

A thickness measuring apparatus of an embodiment of the present invention and an embodiment of a grinding apparatus including the thickness measuring apparatus will be described in detail below with reference to the accompanying drawings.

Figure 1:
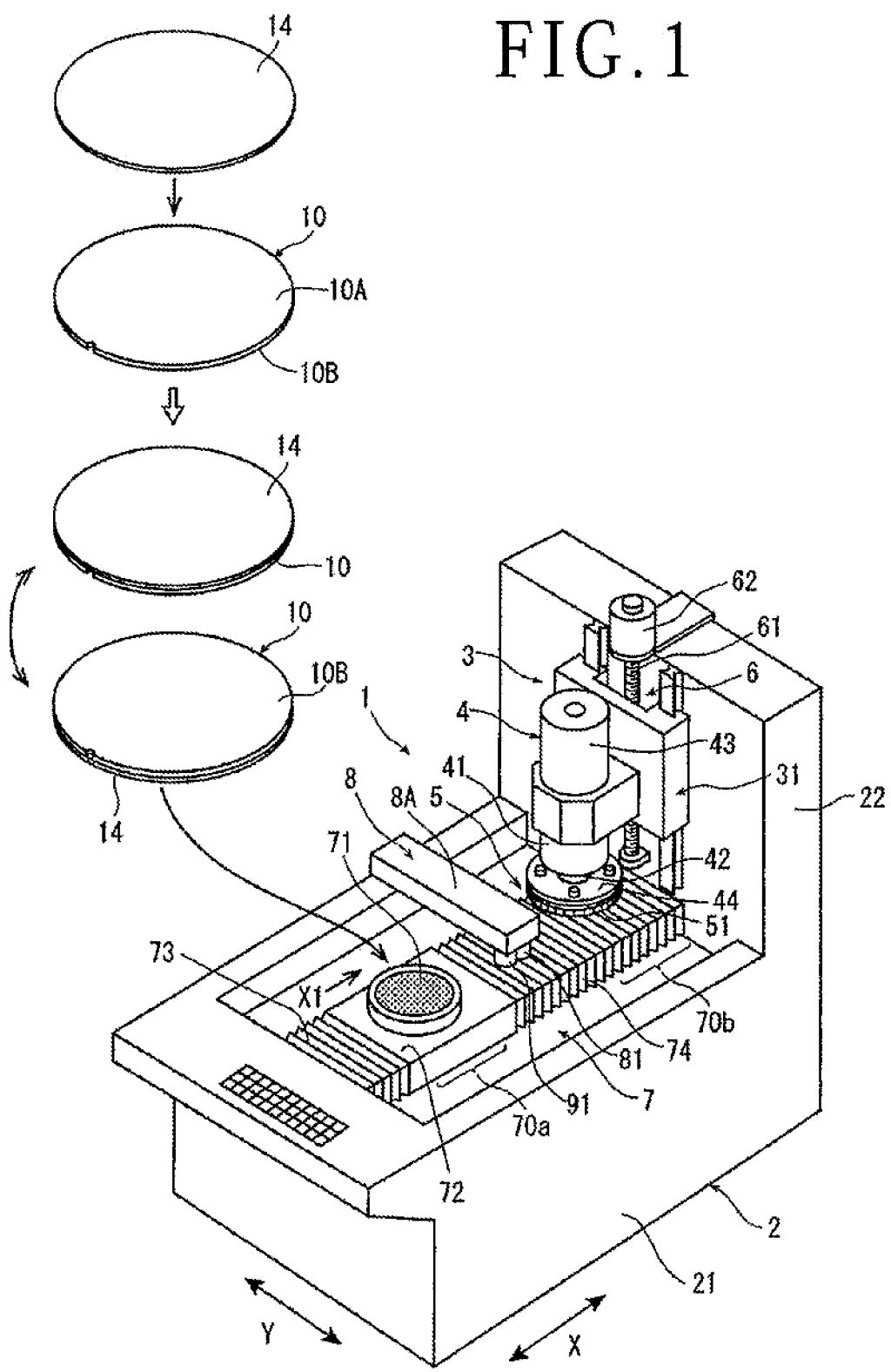
FIG. 1 is an overall perspective view of a grinding apparatus in which a thickness measuring apparatus of an embodiment of the present invention is disposed.

In FIG. 1, an overall perspective view of a grinding apparatus 1 including a thickness measuring apparatus 8 according to the present embodiment and a wafer 10 as a workpiece regarding which a thickness is measured by the thickness measuring apparatus 8 of the present embodiment are depicted. The wafer 10 depicted in FIG. 1 is a composite wafer in which a first layer 10A (layer A) and a second layer 10B (layer B) are formed by different materials, for example.

The grinding apparatus 1 depicted in the diagram includes an apparatus housing 2. The apparatus housing 2 has a main part 21 with a substantially rectangular parallelepiped shape and an upright wall 22 that is disposed at a rear end part of the main part 21 and extends upward. A grinding unit 3 as a grinding unit is mounted on a front surface of the upright wall 22 movably in an upward-downward direction.

The grinding unit 3 includes a moving base 31 and a spindle unit 4 mounted on the moving base 31. The moving base 31 is configured to slidably engage with a pair of guide rails disposed on the upright wall 22. To a front surface of the moving base 31 slidably mounted on a pair of guide rails disposed on the upright wall 22 as above, the spindle unit 4 as the grinding unit is attached with the intermediary of a support part that protrudes forward.

The spindle unit 4 includes a spindle housing 41, a rotating spindle 42 rotatably disposed in the spindle housing 41, and a servomotor 43 as a drive source for rotationally driving the rotating spindle 42. The rotating spindle 42 rotatably supported by the spindle housing 41 is disposed in such a manner that one end part (lower end part in FIG. 1) thereof protrudes from a lower end of the spindle housing 41, and a wheel mount 44 is disposed on the lower end part. Further, a grinding wheel 5 is attached to a lower surface of the wheel mount 44. A grinding abrasive stone 51 composed of plural segments is disposed on a lower surface of the grinding wheel 5.

The grinding apparatus 1 depicted in the diagram includes a grinding unit feed mechanism 6 that moves the grinding unit 3 in the upward-downward direction along the pair of guide rails. The grinding unit feed mechanism 6 includes a male screw rod 61 that is disposed on a front side of the upright wall 22 and extends upward vertically substantially and a pulse motor 62 as a drive source for rotationally driving the male screw rod 61, and is configured by a bearing component or the like that is not depicted in the diagram and is disposed on a back surface of the moving base 31 and screws to the male screw rod 61. When the pulse motor 62 rotates forward, the grinding unit 3 is lowered together with the moving base 31. When the pulse motor 62 rotates reversely, the grinding unit 3 is raised together with the moving base 31.

A chuck table mechanism 7 as a chuck table that holds the wafer 10 is disposed in the main part 21 of the apparatus housing 2. The chuck table mechanism 7 includes a chuck table 71, a cover component 72 that covers a periphery of the chuck table 71, and accordion means 73 and 74 disposed on front and rear sides of the cover component 72. The chuck table 71 is configured to suck and hold the wafer 10 on an upper surface (holding surface) thereof by actuating suction means that is not depicted in the diagram. Moreover, the chuck table 71 is configured to be allowed to rotate by rotational drive means that is not depicted in the diagram, and is moved between a workpiece placement region 70a depicted in FIG. 1 and a grinding region 70b opposed to the grinding wheel 5 (an X-axis direction depicted by an arrow X) by chuck table movement means that is not depicted in the diagram.

The above-described servomotor 43, pulse motor 62, chuck table movement means that is not depicted in the diagram and so forth are controlled by control means that is not depicted in the diagram. Further, in the wafer 10, a notch that represents a crystal orientation is formed at a circumferential part in the embodiment depicted in the diagram. A protective tape 14 as a protective component is stuck to a front surface side on which the first layer 10A (layer A) of the wafer 10 is formed, and the wafer 10 is held by the upper surface (holding surface) of the chuck table 71, with the side of the protective tape 14 oriented downward.

The thickness measuring apparatus 8 includes a measurement housing 8A and is disposed on a lateral side of an intermediate position on a path through which the chuck table 71 is moved between the workpiece placement region 70a and the grinding region 70b in an upper surface of the main part 21 that configures the apparatus housing 2 as depicted in the diagram and has a rectangular parallelepiped shape. Further, the thickness measuring apparatus 8 is disposed movably in the region in which the chuck table 71 moves between the workpiece placement region 70a and the grinding region 70b, and is disposed in order to measure the thickness of the wafer 10 held on the chuck table 71 by white light with which irradiation is executed from the upper side. On a lower surface of the tip part of the measurement housing 8A, two light condensers 81 and 91 that face the chuck table 71 positioned directly under them and collect and emit white light for thickness measurement are disposed. The light condensers 81 and 91 are configured to be capable of reciprocating by drive means that is not depicted in the diagram together with the measurement housing 8A in a direction depicted by an arrow Y in the diagram (a Y-axis direction). The optical system that configures the thickness measuring apparatus 8 housed in the measurement housing 8A will be described in more detail with reference to FIG. 2.

Figure 2:
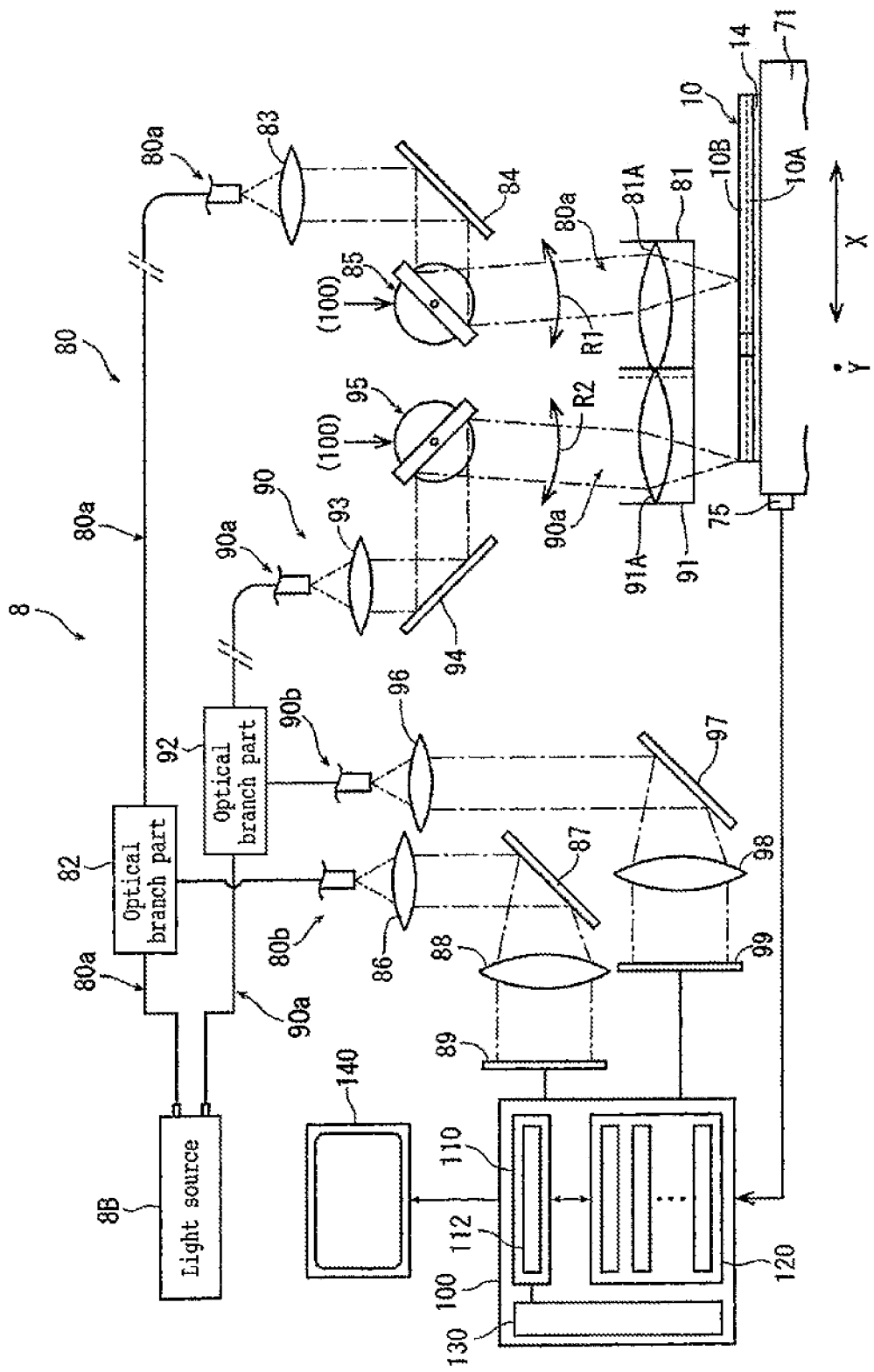
FIG. 2 is a block diagram depicting an outline of optical systems disposed in the thickness measuring apparatus illustrated in FIG. 1.

As depicted in FIG. 2, the optical system that configures the thickness measuring apparatus 8 includes a light source 8B that emits white light of a wide wavelength region with which the chuck table 71 is irradiated. The light emitted from the light source 8B is guided to a side of a first optical system 80 and a side of a second optical system 90.

First, the first optical system 80 will be described below with reference to FIG. 2. In the light generated from the light source 8B, white light made to communicate through passing through an optical branch part 82 that guides reflected light that is guided to a first optical path 80a and goes backward in the first optical path 80a to a second optical path 80b and the first optical path 80a is turned to collimated light by a collimation lens 83. Then, the optical path of the collimated light is changed by a reflective mirror 84 and the collimated light is guided to a scanner 85 controlled by a control signal from thickness output means 100. The scanner 85 is configured by a galvano mirror, for example, and the optical path of the white light of the first optical path 80a is changed to desired directions depicted by an arrow R1 in the diagram by the scanner 85. This white light is guided to an fθ lens 81A held by a lens barrel that configures the light condenser 81 and a focal position is changed as appropriate on the wafer 10 on the chuck table 71. The scanner 85 is not limited to the above-described galvano mirror, and it is also possible to configure the scanner 85 by a polygon mirror, a resonant scanner, or the like.

As the light source 8B, a halogen lamp that emits white light can be used, for example. The term "light source that emits white light" in the present invention is a light source that executes irradiation including light with a wavelength of 400 to 800 nm generally referred to as the visible light beam and is not limited to the above-described halogen lamp. As the light source 8B, for example, a light source can be selected as appropriate from well-known light sources such as SLD light source, an ASE light source, a supercontinuum light source, an LED light source, a xenon light source, a mercury light source, and a metal halide light source that can emit white light and are generally known. As the optical branch part 82, a polarization-maintaining fiber coupler, a polarization-maintaining circulator, a single-mode fiber coupler, a single-mode fiber coupler circulator, or the like can be used.

On the path of the second optical path 80b made to branch by the optical branch part 82, a collimation lens 86, a diffraction grating 87, a collecting lens 88, and an image sensor 89 are disposed. The collimation lens 86 forms, into collimated light, reflected light that is reflected by the wafer 10 held by the chuck table 71 and goes backward in the first optical path 80a and is guided from the optical branch part 82 to the second optical path 80b. The diffraction grating 87 diffracts the above-described reflected light formed into the collimated light by the collimation lens 86 and sends diffracted light corresponding to each wavelength to the image sensor 89 through the collecting lens 88. The image sensor 89 is what is generally called a line image sensor in which light receiving elements are arranged in a straight line manner and detects the intensity of light of each wavelength of the reflected light diffracted by the diffraction grating 87 to send a light intensity signal to the thickness output means 100. The optical path that ranges from the light source 8B to the collimation lens 83 in the first optical path 80a that ranges from the light source 8B to the light condenser 81 via the optical branch part 82 and part of the second optical path 80b that ranges from the optical branch part 82 to the image sensor 89 are configured by optical fibers.

Subsequently, the second optical system 90 as the other optical system will be described below with reference to FIG. 2. The second optical system 90 has substantially the same configurations as the first optical system 80 and detailed description of the respective configurations is omitted as appropriate.

In the light generated from the light source 8B, white light made to communicate through passing through an optical branch part 92 that guides reflected light that is guided to a first optical path 90a disposed on the side of the second optical system 90 and goes backward in the first optical path 90a to a second optical path 90b and the first optical path 90a is turned to collimated light by a collimation lens 93. Then, the optical path of the light is changed by a reflective mirror 94 and the light is guided to a scanner 95 controlled by a control signal from the thickness output means 100. The white light whose optical path is changed to desired directions depicted by an arrow R2 in the diagram by the scanner 95 is guided to an fθ lens 91A held by the light condenser 91 and the focal position is changed as appropriate on the wafer 10 on the chuck table 71, so that the white light is focused on a desired position.

On the path of the second optical path 90b made to branch by the optical branch part 92, a collimation lens 96, a diffraction grating 97, a collecting lens 98, and an image sensor 99 are disposed. The collimation lens 96 forms, into collimated light, reflected light that is reflected by the wafer 10 held by the chuck table 71 and goes backward in the first optical path 90a and is guided from the optical branch part 92 to the second optical path 90b. The diffraction grating 97 diffracts the above-described reflected light formed into the collimated light by the collimation lens 96 and sends diffracted light corresponding to each wavelength to the image sensor 99 through the collecting lens 98. The image sensor 99 is what is generally called a line image sensor in which light receiving elements are arranged in a straight line manner and detects the intensity of light of each wavelength of the reflected light diffracted by the diffraction grating 97 to send a light intensity signal to the thickness output means 100.

As is understood from the above description, the thickness measuring apparatus 8 of the present embodiment includes the light source 8B that emits white light. The thickness measuring apparatus 8 includes the two light condensers 81 and 91 that condense the white light emitted by the light source 8B on the wafer 10 held by the chuck table 71, the two first optical paths 80a and 90a that make the light source 8B and the light condensers 81 and 91 communicate with each other, and the two optical branch parts 82 and 92 that are disposed on the two first optical paths 80a and 90a and cause reflected light reflected from the wafer 10 held by the chuck table 71 to branch into the two second optical paths 80b and 90b. The thickness measuring apparatus 8 also includes the two diffraction gratings 87 and 97 disposed on the two second optical paths 80b and 90b, the two image sensors 89 and 99 that detect the intensity of light spectrally split on each wavelength basis by the two diffraction gratings 87 and 97 and generate spectral interference waveforms, and the thickness output means 100 that outputs thickness information from the spectral interference waveforms generated by the two image sensors 89 and 99. Moreover, the fθ lenses 81A and 91A are disposed in the two light condensers 81 and 91, respectively. The light condenser 81 and the light condenser 91 are set to share the measurement region on the wafer 10 by the fθ lens 81A and the fθ lens 91A disposed in them. This point will be described below with reference to FIG. 3.

Figure 3:
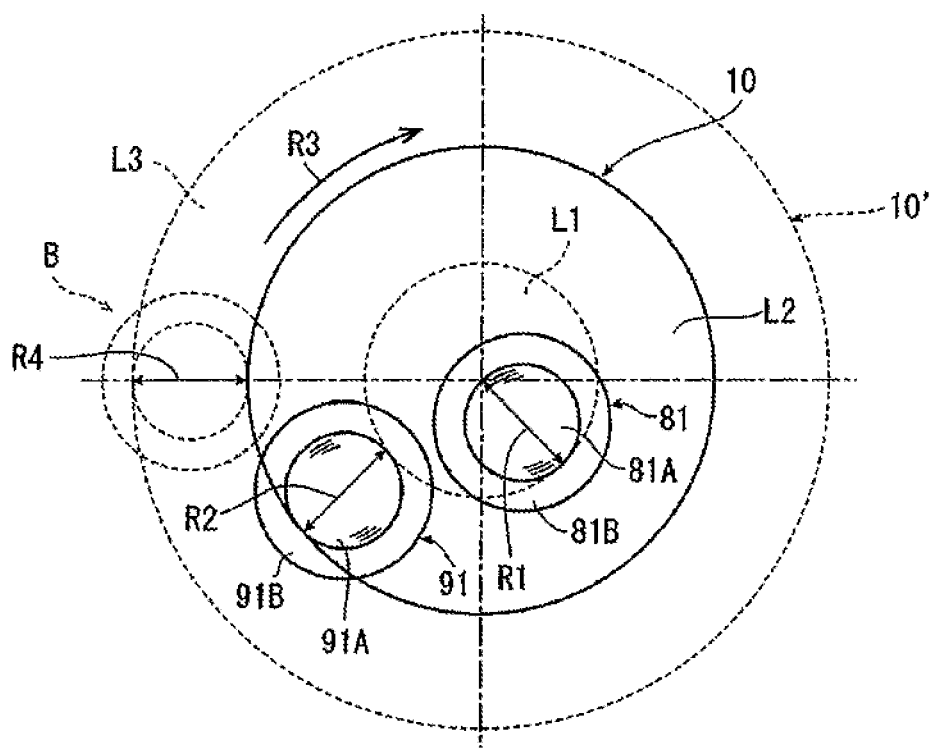
FIG. 3 is a plan view depicting a relation between a wafer and fθ lenses when a thickness of the wafer is measured by the thickness measuring apparatus depicted in FIG. 2.

In FIG. 3, a plan view of the state in which the fθ lenses 81A and 91A are positioned above the wafer 10 held on the chuck table 71 is depicted. When the thickness of the wafer 10 is measured in the present embodiment, while the wafer 10 is rotated in a direction depicted by an arrow R3 together with the chuck table 71, the wafer 10 is irradiated with white light from the two fθ lenses 81A and 91A to execute the thickness measurement. Here, as depicted in the diagram, the two fθ lenses 81A and 91A are set at shifted positions so that centers of the fθ lenses 81A and 91A may be kept from corresponding with each other in a radial direction as viewed from a center of the wafer 10.

In the case of driving the scanners 85 and 95 and irradiating the wafer 10 with the white light from the fθ lenses 81A and 91A, the regions used for irradiating desired positions with the white light from the fθ lenses 81A and 91A are central regions of the light condensers 81 and 91 excluding outside invalid regions 81B and 91B including lens barrels. Thus, in the case of irradiating the whole region of the wafer 10 with the white light through the fθ lenses 81A and 91A and measuring the thickness of the wafer 10, irradiation of an inside region L1 of the wafer 10 with the white light is assigned to the fθ lens 81A and irradiation of an outside region L2 of the wafer 10 with the white light is assigned to the fθ lens 91A. More specifically, as described above, while the wafer 10 is rotated in the direction depicted by the R3, scanning with the white light is executed in the direction depicted by the R1 by the scanner 85 and scanning with the white light is executed in the direction depicted by the R2 by the scanner 95. As above, the whole region on the wafer 10 can be irradiated with the white light by disposing the fθ lenses 81A and 91A in such a manner that the fθ lenses 81A and 91A share the measurement region on the wafer 10 and combining the driving of the scanners 85 and 95 disposed corresponding to the fθ lenses 81A and 91A and the rotation of the wafer 10 in the direction of the arrow R3.

Referring back to FIG. 2, the thickness output means 100 is configured by a computer and includes a central processing unit (CPU) that executes arithmetic processing in accordance with a control program, a read only memory (ROM) that stores the control program and so forth, a readable-writable random access memory (RAM) for temporarily storing a detected value obtained by detection, an arithmetic result, and so forth, an input interface, and an output interface (diagrammatic representation about details is omitted).

The thickness output means 100 generates a spectral interference waveform based on the light intensity signal of each wavelength sent from the image sensors 89 and 99 and this spectral interference waveform is temporarily stored in the RAM that is not depicted in the diagram. In the thickness output means 100, a thickness deciding section 110 that decides the thickness of the wafer 10 based on the spectral interference waveform and a reference waveform recording section 120 in which spectral interference waveforms corresponding to plural thicknesses are recorded as reference waveforms are further included. In the thickness deciding section 110, a collating section 112 that compares the spectral interference waveform that is detected by the image sensors 89 and 99 and is stored in the RAM with the reference waveforms recorded in the reference waveform recording section 120 is included. The chuck table 71 is equipped with position detecting means 75 that detects an X coordinate (left-right direction in the diagram) and a Y coordinate (direction perpendicular to the plane of drawing) of the chuck table 71. Driving of the scanners 85 and 95 is controlled according to the coordinate position of the chuck table 71 detected by the position detecting means 75 and the positions of the white light with which irradiation is executed from the fθ lenses 81A and 91A are accurately controlled. Thickness information decided by the thickness deciding section 110 is associated with the X coordinate and the Y coordinate of the wafer 10 held by the chuck table 71 detected by the position detecting means 75 and is recorded in a thickness recording section 130. The thickness information stored in the thickness recording section 130 can be output to display means 140 as appropriate. The thickness output means 100 of the present embodiment is configured in control means that has various control programs to execute control of the grinding apparatus 1 and is not depicted in the diagram.

The reference waveform recording section 120 will be described more specifically with reference to FIG. 4. For example, the reference waveform recording section 120 includes material-by-material reference waveform recording sections 122a to 122l in which reference waveforms are recorded according to the material that forms the workpiece.

In the material-by-material reference waveform recording section 122a, a thicknesses (μm) of a silicon (Si) wafer are recorded and reference waveforms of the spectral interference waveform generated based on the light intensity signal detected by the image sensors 89 and 99 when the Si wafer is irradiated with white light from the light condensers 81 and 91 of the thickness measuring apparatus 8 are recorded according to the thickness. Similarly, a thicknesses (μm) of a lithium niobate (LN) wafer and reference waveforms of the spectral interference waveform are recorded in the material-by-material reference waveform recording section 122b. A thicknesses (μm) of a gallium nitride (GaN) wafer and reference waveforms of the spectral interference waveform are recorded in the material-by-material reference waveform recording section 122c. A thicknesses (μm) of a silicon dioxide ($SiO_2$) wafer and reference waveforms of the spectral interference waveform are recorded in the material-by-material reference waveform recording section 122d. The above-described material-by-material reference waveform recording sections 122a to 122d are sections in which reference waveforms are recorded corresponding to the wafer composed of a single material and part of the data is omitted for convenience of description.

In the reference waveform recording section 120, in addition to the above-described material-by-material reference waveform recording sections 122a to 122d in which reference waveforms are recorded corresponding to a single material, material-by-material reference waveform recording sections 122k and 122l set with an assumption of the case in which the wafer that is the workpiece is a composite wafer including plural layers (a first layer (upper layer) and a second layer (lower layer)) with different materials are included.

Figure 4:
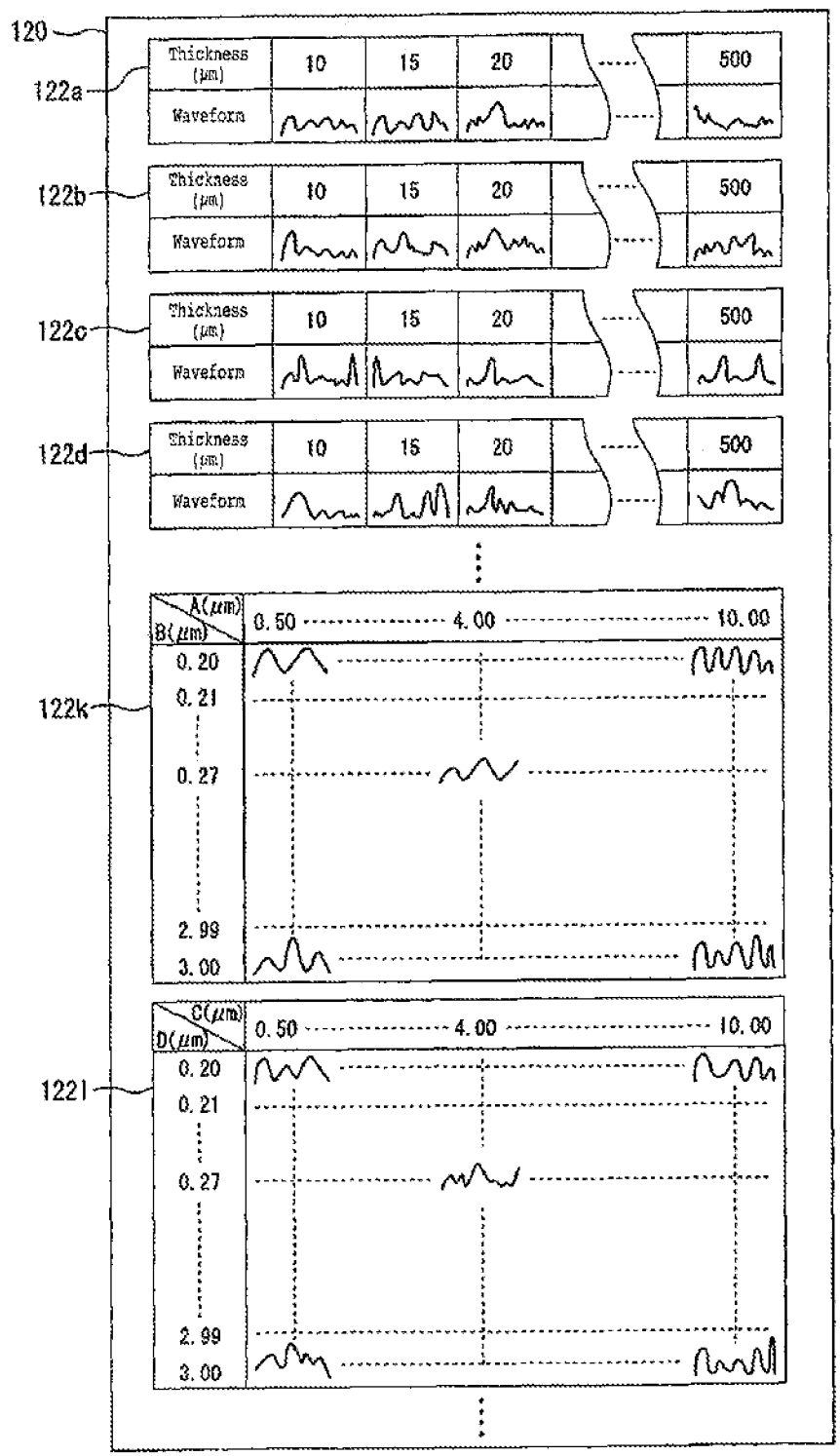
FIG. 4 is a conceptual diagram depicting an outline of material-by-material reference waveform recording sections disposed in the thickness measuring apparatus depicted in FIG. 1.

In the material-by-material reference waveform recording section 122k in FIG. 4, the first layer is a layer A (LN) and the second layer is a layer B ($SiO_2$ layer) and reference waveforms of the spectral interference waveform generated when irradiation with white light condensed from the light condensers 81 and 91 is executed are recorded in a matrix table formed regarding each thickness of the layer A and the layer B. The reference waveforms are recorded in this matrix table in such a manner that an abscissa axis corresponds to a thickness (μm) of the layer A and an ordinate axis corresponds to a thickness (μm) of the layer B, and the thicknesses of the layer A and the layer B can be individually decided based on the reference waveform. Further, in the material-by-material reference waveform recording section 122l, the first layer is a layer C (LN) and the second layer is a layer D (GaN) and, similarly to the material-by-material reference waveform recording section 122k, reference waveforms of the spectral interference waveform generated when irradiation with white light from the light condensers 81 and 91 is executed are recorded in a matrix table formed regarding each thickness of the layer C and the layer D. In FIG. 4, it is depicted that the material-by-material reference waveform recording sections 122k and 122l relating to two composite wafers are included in the reference waveform recording section 120. However, it is also possible to further record a material-by-material reference waveform recording section set with an assumption of a composite wafer formed of a combination of other materials. The reference waveform recorded in the reference waveform recording section 120 can be obtained as a theoretical waveform based on an arithmetic operation by a computer.

The grinding apparatus 1 and the thickness measuring apparatus 8 according to the present embodiment have the configurations as described above substantially. An implementation form of measuring the thickness of the wafer 10 by using the thickness measuring apparatus 8 disposed for the grinding apparatus 1 will be described below.

First, for execution of grinding processing, an operator sets a target finished thickness of the wafer 10 by using an operation panel of the grinding apparatus 1. As depicted in FIG. 1, the protective tape 14 is stuck to the front surface side of the wafer 10 and the wafer 10 is placed on the chuck table 71 positioned in the workpiece placement region 70a, with the side of the protective tape 14 set on the lower side. Then, the wafer 10 is sucked and held on the chuck table 71 by actuating suction means that is not depicted in the diagram. After the wafer 10 has been sucked and held on the chuck table 71, the movement means that is not depicted in the diagram is actuated, and the chuck table 71 is moved from the side of the workpiece placement region 70a in a direction depicted by an arrow X1 in the X-axis direction and is positioned directly under the thickness measuring apparatus 8. Then, the thickness measuring apparatus 8 is moved in the direction depicted by the arrow Y and the fθ lenses 81A and 91A of the light condensers 81 and 91 of the thickness measuring apparatus 8 are positioned over the inside region L1 and the outside region L2 of the wafer 10 as described based on FIG. 3 and are positioned to the thickness measurement positions on the wafer 10 held by the chuck table 71. The timing when the chuck table 71 is positioned to this thickness measurement position is a timing before the execution of the grinding processing or in the middle of the execution or after the execution, and the thickness measurement can be executed at an optional timing.

Figure 5A:
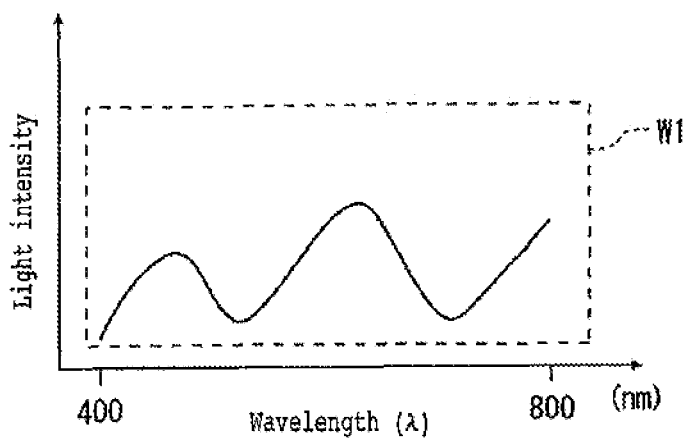
FIG. 5A is a diagram depicting one example of a spectral interference waveform generated by a light intensity signal detected by an image sensor.
Figure 5B:
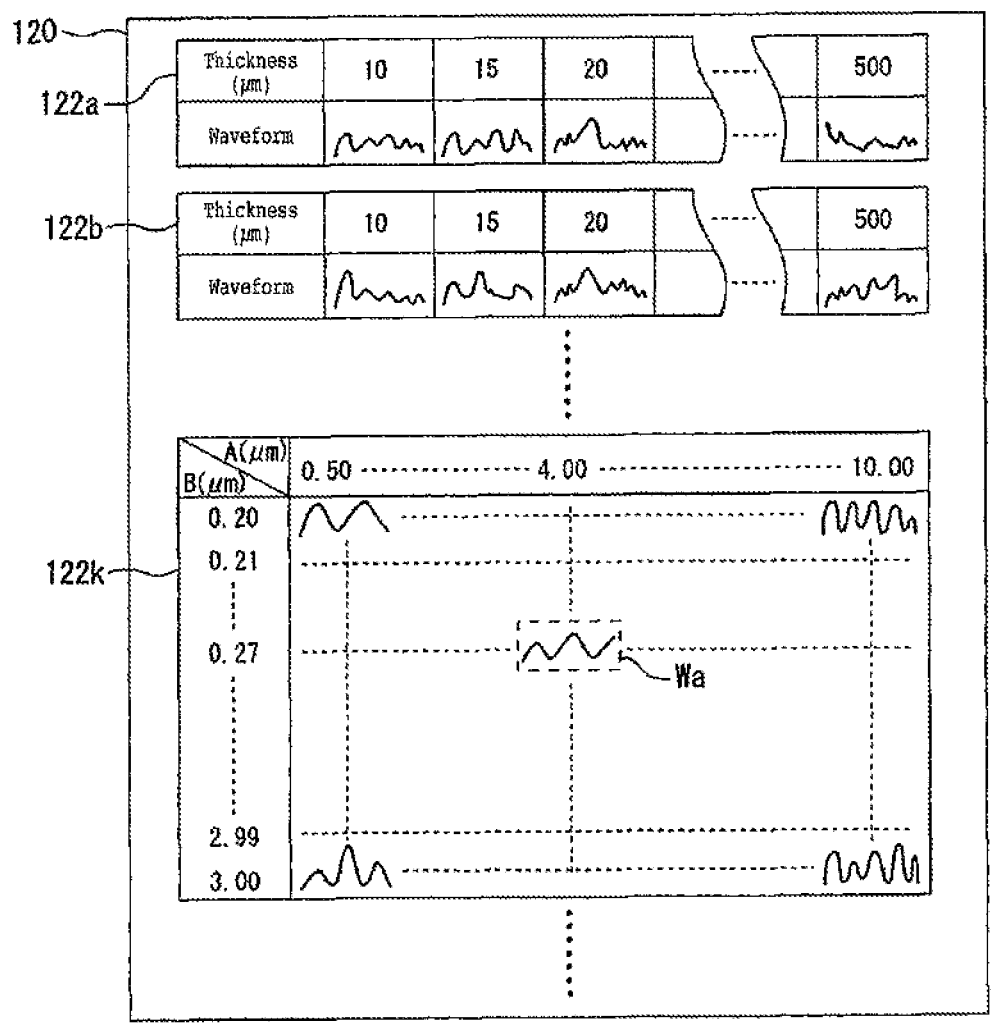
FIG. 5B is a conceptual diagram depicting a form of collating the spectral interference waveform depicted in FIG. 5A with a reference waveform that corresponds with the spectral interference waveform and deciding the thickness.

After the wafer 10 has been positioned directly under the thickness measuring apparatus 8, by an instruction signal of the thickness output means 100, white light oscillated by the light source 8B is condensed by the light condensers 81 and 91 and the wafer 10 is irradiated with the white light while scanning with the focal position of the white light is executed in the directions of the R1 and the R2 by the scanners 85 and 95. At this time, the wafer 10 is caused to make one rotation at a predetermined rotation speed together with the chuck table 71. Here, plural spectral interference waveforms are generated based on the light intensity signal of each of the image sensors 89 and 99. In FIG. 5A, a spectral interference waveform W1 generated by the image sensor 99 through execution with the white light at coordinates $(X_1, Y_1)$ on the wafer 10 held by the chuck table 71 is depicted. After the spectral interference waveform W1 has been generated in this manner, the spectral interference waveform W1 is recorded in the RAM of the thickness output means 100, and the spectral interference waveform W1 stored in the RAM is compared with the reference waveforms recorded in the respective material-by-material reference waveform recording sections 122a to 122l of the reference waveform recording section 120 by the collating section 112 of the thickness deciding section 110. As a result, it is determined that a reference waveform Wa that corresponds with the spectral interference waveform W1 in the waveform shape and the phase belongs to the material-by-material reference waveform recording section 122k in the reference waveform recording section 120 depicted in FIG. 5B, and the material-by-material reference waveform recording section 122k is selected. Specifically, it is decided that the wafer 10 is a composite wafer composed of two layers in which the first layer 10A (layer A) of the wafer 10 is lithium niobate (LN) and the second layer 10B (layer B) is an $SiO_2$ layer and a thickness of the first layer 10A ($TA_1$)

at coordinates $(X_1, Y_1)$ is 4.00 μm and a thickness of the second layer 10B ($TB_1$) is 0.27 μm.

Figure 6:
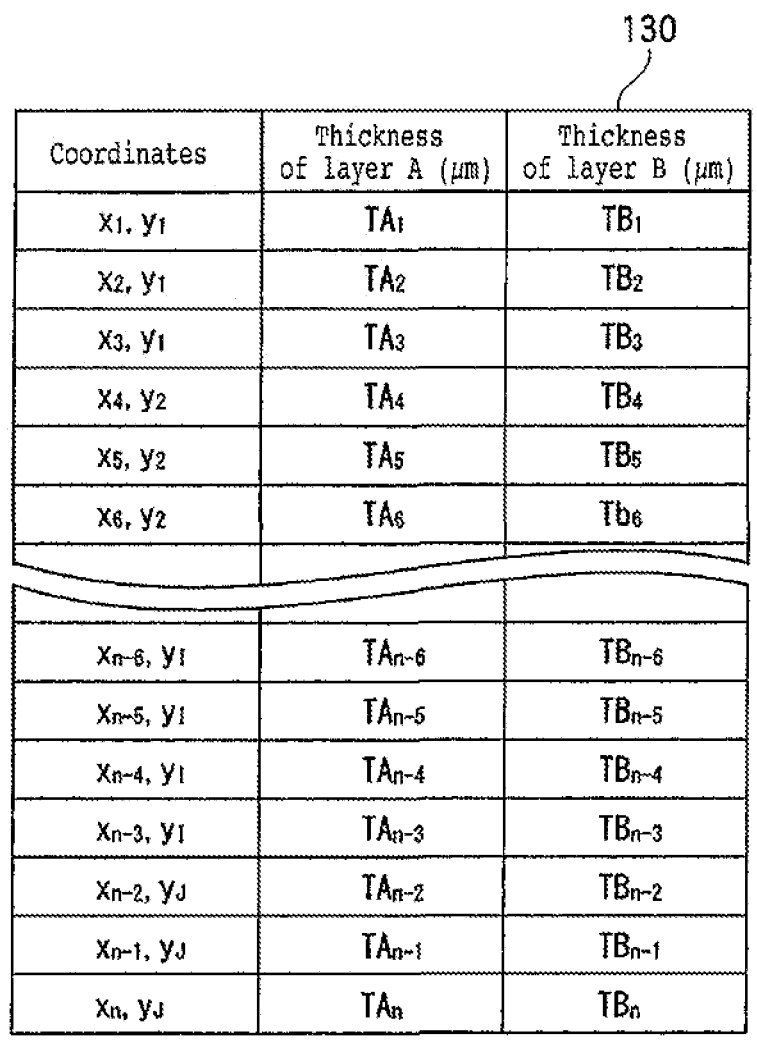
FIG. 6 is a conceptual diagram of a thickness recording section disposed in the thickness measuring apparatus depicted in FIG. 1.

As described above, by executing scanning with the focal position of the white light in the directions of the R1 and the R2 by the scanners 85 and 95 while rotating the chuck table 71, irradiation with the white light is executed over the whole region of the wafer 10 and thicknesses $TA_1$ to $TA_n$ of the first layer 10A and thicknesses $TB_1$ to $TB_n$ of the second layer 10B corresponding to the respective coordinate positions are measured over the whole region $((X_1, Y_1)$ to $(X_n, Y_j))$ of the wafer 10. The measured thickness information is recorded in the thickness recording section 130 depicted in FIG. 6 together with the XY coordinates $((X_1, Y_1)$ to $(X_n, Y_j))$ defined on the chuck table 71 and is displayed on the display means 140 according to need. After the thicknesses of the whole region of the wafer 10 have been recorded in the thickness recording section 130 in this manner, evaluation is made regarding whether the wafer 10 has reached a desired thickness by the grinding processing, or whether the wafer 10 has been processed into an even thickness, or the like according to need. If the above-described thickness measurement is executed in the middle of the grinding processing, the chuck table 71 is moved to the grinding region 70b opposed to the grinding wheel 5 and the grinding processing is executed by a predetermined thickness.

The thickness measuring apparatus 8 of the above-described embodiment includes the thickness deciding section 110 that compares the spectral interference waveform generated based on the light intensity signals detected by the image sensors 89 and 99 with the reference waveforms recorded in the reference waveform recording section 120 and decides the thickness from the reference waveform that corresponds with the spectral interference waveform in the waveform shape. In addition, the reference waveform recording section 120 includes plural material-by-material reference waveform recording sections (122a to 122l) in which reference waveforms are recorded according to the material that forms the workpiece. Due to this, the thickness can be measured with high accuracy according to the material that forms the workpiece. Further, even with a workpiece formed of a structure with two or more layers, the thicknesses can be individually measured accurately according to the materials in the respective layers. Moreover, in the above-described embodiment, the light condensers include the two fθ lenses 81A and 91A that have a small diameter and are disposed to share the measurement region of the workpiece and the two scanners 85 and 95 disposed corresponding to the respective fθ lenses. Due to this, without using an expensive fθ lens that has large diameter and heavy weight, the inexpensive fθ lenses that have a smaller diameter than the radius of the wafer 10 and a light weight can be used and the thickness of the whole surface of the wafer 10 can be efficiently measured at low cost.

According to the present invention, the configuration is not limited to the above-described embodiment and various modification examples are provided. For example, the thickness measuring apparatus 8 of the above-described embodiment includes the first optical system 80 and the second optical system 90 and thereby includes the two light condensers 81 and 91, the two first optical paths 80a and 90a, the two optical branch parts 82 and 92 that allow branching into the two second optical paths 80b and 90b, the two diffraction gratings 87 and 97, and two image sensors. However, the present invention is not limited thereto and the thickness measuring apparatus 8 may include three or more optical systems in conformity to the size of the wafer 10. For example, as depicted in FIG. 3, in the case of measuring the thickness of a wafer 10' (depicted by a dotted line) larger than the wafer 10, a third optical system with the same configuration as the first optical system 80 and the second optical system 90 may be disposed in the thickness measuring apparatus 8 in conformity to the size of the wafer 10', and a third fθ lens B (depicted by a dotted line) corresponding to an outermost peripheral region L3 of the wafer 10' may be disposed in addition to the two fθ lenses 81A and 91A. Further, by using the fθ lens B, irradiation with white light may be executed while scanning with the white light is executed in a direction depicted by an R4 to measure the thickness of the region L3.

Figure 7A:
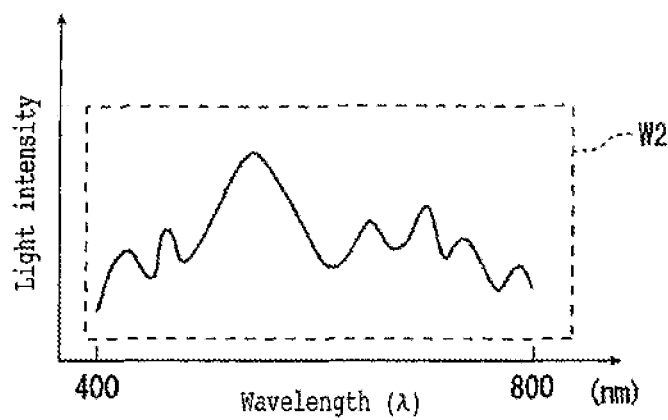
FIG. 7A is a diagram depicting another example of the spectral interference waveform generated by the light intensity signal detected by the image sensor.
Figure 7B:
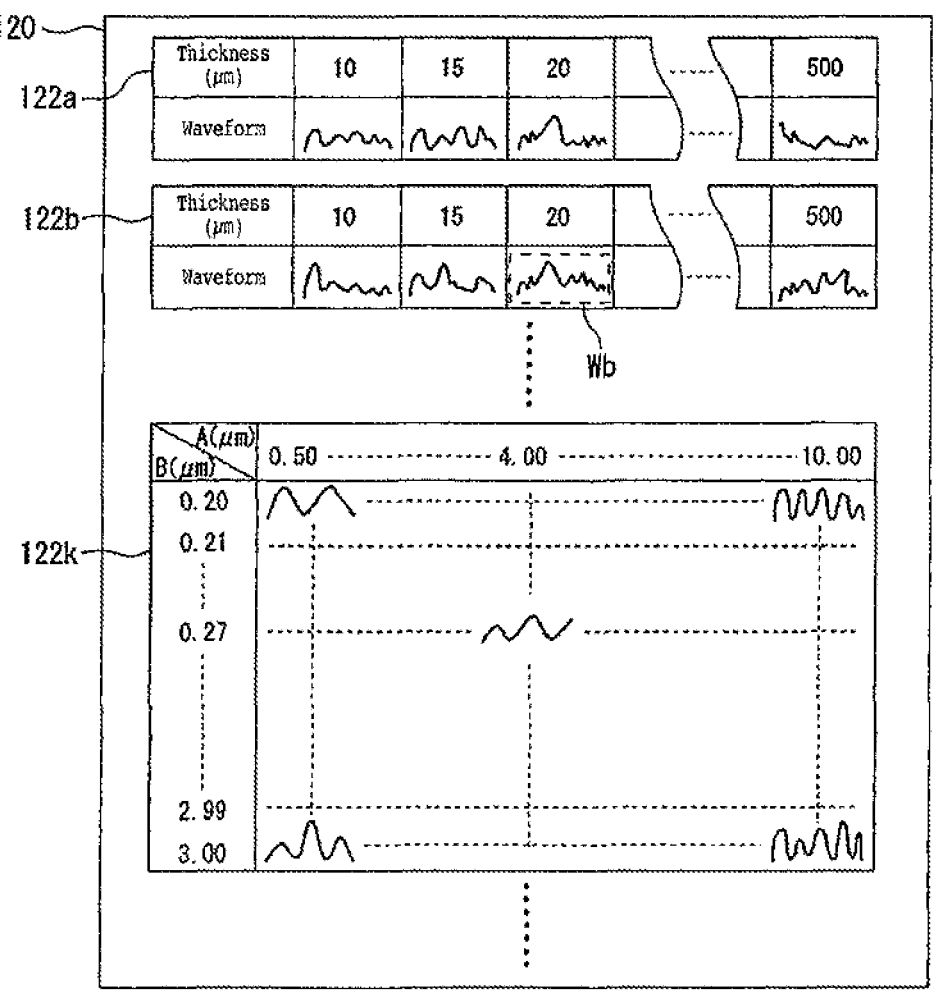
FIG. 7B is a conceptual diagram depicting a form of collating the spectral interference waveform depicted in FIG. 7A with the reference waveform that corresponds with the spectral interference waveform and deciding the thickness.

Further, in the above-described embodiment, the example is depicted in which the thickness is measured when the wafer 10 is a composite wafer composed of the first layer 10A and the second layer 10B. However, the present invention is not limited thereto and can also measure the thickness of a workpiece (wafer) composed of a single material. In FIG. 7A, a spectral interference waveform W2 generated by the image sensor 89 (or image sensor 99) through irradiation with a wafer composed of a single material with white light is depicted. After the spectral interference waveform W2 has been generated in this manner, the spectral interference waveform W2 is recorded in the RAM of the thickness output means 100 and the spectral interference waveform W2 stored in the RAM is compared with the reference waveforms recorded in the respective material-by-material reference waveform recording sections 122a to 122l of the reference waveform recording section 120 by the collating section 112 of the thickness deciding section 110. As a result, it is determined that a reference waveform Wb that corresponds with the spectral interference waveform W2 in the waveform shape and the phase belongs to the material-by-material reference waveform recording section 122b in the reference waveform recording section 120 depicted in FIG. 7B, and the material-by-material reference waveform recording section 122b is selected. Specifically, it is confirmed that the wafer irradiated with the white light is composed of a single material and is formed of an LN substrate. If it is determined that the shape of the spectral interference waveform W2 corresponds with the reference waveform Wb that belongs to the material-by-material reference waveform recording section 122b by the thickness deciding section 110 as above, the thickness (20 μm) corresponding to the position from which the reference waveform Wb has been recorded in the material-by-material reference waveform recording section 122b is decided as the thickness of the wafer 10, and the thickness can be output from the thickness output means 100 to the display means 140 and be stored in the RAM.

Further, in the above-described embodiment, the example is depicted in which the thickness of the wafer 10 is measured regarding each layer when the wafer 10 is a composite wafer composed of two layers in which the first layer 10A (layer A) of the wafer 10 is lithium niobate (LN) and the second layer 10B (layer B) is an $SiO_2$ layer. However, for example, the wafer 10 may be a composite wafer in which the second layer 10B (layer B) is composed of two or more kinds of materials in the planar direction. For example, it is also possible to measure, by the thickness measuring apparatus 8 of the present embodiment, the thickness of a composite wafer composed of two layers in which the first layer 10A is lithium niobate (LN) and the second layer 10B is an $SiO_2$ layer in the region L1 on the wafer 10 depicted in FIG. 3 and the first layer 10A is lithium niobate (LN) and the second layer 10B is gallium nitride (GaN) in the region L2 on the wafer 10. In this case, reference to the material-by-material reference waveform recording section 122k is made based on a spectral interference waveform generated by the image sensor 89 when the region L1 on the wafer 10 is irradiated with white light by the light condenser 81 disposed in the first optical system 80, and the thicknesses of the first layer 10A and the second layer 10B are measured. Further, reference to the material-by-material reference waveform recording section 122l is made based on a spectral interference waveform generated by the image sensor 99 when the region L2 on the wafer 10 is irradiated with white light by the light condenser 91 disposed in the second optical system 90, and the thicknesses of the first layer 10A and the second layer 10B are measured.

In the above-described embodiment, the example in which the thickness measuring apparatus 8 is disposed in the grinding apparatus 1 is depicted. However, the present invention is not limited thereto and the thickness measuring apparatus 8 may be set as an apparatus independent of the grinding apparatus 1.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A thickness measuring apparatus that measures a thickness of a workpiece held by a chuck table, the thickness measuring apparatus comprising:
    a light source that emits white light;
    a plurality of light condensers that condense the white light emitted by the light source on the workpiece held by the chuck table;
    a plurality of first optical paths that optically couple the light source and the light condensers with each other;
    a first scanner associated with the plurality of first optical paths, said first scanner configured to move in a direction to change a focal position of the white light of the plurality of first optical paths on the workpiece;
    a plurality of optical branch parts that are disposed on the plurality of first optical paths respectively and cause reflected light reflected from the workpiece held by the chuck table to branch into a plurality of second optical paths;
    a second scanner associated with the plurality of second optical paths, said second scanner configured to move in a direction to change a focal position of the white light of the plurality of second optical paths on the workpiece;
    a plurality of diffraction gratings each disposed on the plurality of second optical paths;
    a plurality of image sensors that detect intensity of light spectrally split on each wavelength basis by the plurality of diffraction gratings and generate a spectral interference waveform; and
    thickness output means that outputs thickness information from the spectral interference waveform generated by the plurality of image sensors,
    wherein the light condensers include
        a plurality of fθ lenses disposed to share a measurement region of the workpiece, and
        a first one of the plurality of fθ lenses being associated with the first scanner and a second one of the plurality of fθ lenses being associated with the second scanner and
    the thickness output means includes
        a reference waveform recording section in which spectral interference waveforms corresponding to a plurality of thicknesses are recorded as reference waveforms, and
        a thickness deciding section that compares a plurality of spectral interference waveforms generated by the plurality of image sensors with the reference waveforms recorded in the reference waveform recording section and decides a thickness corresponding to each spectral interference waveform from the reference waveform that corresponds to the spectral interference waveform in a waveform shape.

2. The thickness measuring apparatus according to claim 1, wherein
    the reference waveform recording section includes a plurality of material-by-material reference waveform recording sections in which reference waveforms are recorded according to a material that forms the workpiece, and
    the thickness deciding section of the thickness output means compares the spectral interference waveform generated by the image sensor with the reference waveforms recorded in the plurality of material-by-material reference waveform recording sections included in the reference waveform recording section and selects the material-by-material reference waveform recording section to which the reference waveform that corresponds to the spectral interference waveform in a waveform shape belongs.

3. The thickness measuring apparatus according to claim 1, wherein the workpiece is a composite wafer configured to include at least a layer A and a layer B.

4. The thickness measuring apparatus according to claim 1, wherein the workpiece composed of a plurality of materials is a composite wafer that includes at least a layer A and a layer B and in which the layer B is composed of a plurality of materials in a planar direction.

5. The thickness measuring apparatus according to claim 1, wherein the light source is selected from a group consisting of a super luminescent diode light source, an amplified spontaneous emission light source, a supercontinuum light source, a light-emitting diode light source, a halogen light source, a xenon light source, a mercury light source, and a metal halide light source.

6. The thickness measuring apparatus according to claim 1, wherein the first scanner is a rotatable scanner that is configured to rotate in a desired radial direction to change a focal position of the white light of the plurality of first optical paths on the workpiece.

7. The thickness measuring apparatus according to claim 1, wherein the second scanner is a rotatable scanner that is configured to rotate in a desired radial direction to change a focal position of the white light of the plurality of second optical paths on the workpiece.

* * * * *